US005410194A

United States Patent [19]
Freidin et al.

[11] Patent Number: 5,410,194
[45] Date of Patent: Apr. 25, 1995

[54] ASYNCHRONOUS OR SYNCHRONOUS LOAD MULTIFUNCTION FLIP-FLOP

[75] Inventors: Philip M. Freidin, Sunnyvale; Charles R. Erickson, Fremont, both of Calif.

[73] Assignee: Xilinx, Inc., San Jose, Calif.

[21] Appl. No.: 105,827

[22] Filed: Aug. 11, 1993

[51] Int. Cl.[6] .......................................... H03K 19/177
[52] U.S. Cl. ........................................ 326/46; 327/218
[58] Field of Search ............. 307/443, 465, 243, 272.2

[56] References Cited

U.S. PATENT DOCUMENTS

| | | | |
|---|---|---|---|
| 4,758,746 | 7/1988 | Birkner et al. | 307/465 |
| 4,758,985 | 7/1988 | Carter | 307/465 X |
| 4,857,773 | 8/1989 | Takata et al. | 307/465 |
| 5,280,202 | 1/1994 | Chan et al. | 307/465 |
| 5,317,210 | 5/1994 | Patel | 307/443 X |

OTHER PUBLICATIONS

Xilinx Programmable Gate Array Data Book, 1992, available from Xilinx, Inc., 2100 Logic Drive, San Jose, Calif. 95124.

*Primary Examiner*—David R. Hudspeth
*Attorney, Agent, or Firm*—Edel M. Young

[57] ABSTRACT

According to the present invention hardware is provided in a user configurable logic integrated circuit chip to allow a user to select multiple storage functions such as D, T, JK, to receive multiple input signals and generate a storage input signal using a function such as OR or MUX, along with parallel load and asynchronous load options. A relatively small hardware area can offer these functions, which are commonly used, and can leave general purpose logic for other more complex functions, thus increasing the amount of logic which a user may implement in a given silicon area.

3 Claims, 3 Drawing Sheets

ASYNCHRONOUS OR SYNCHRONOUS LOAD MULTIFUNCTION FLIP-FLOP

FIELD OF THE INVENTION

The invention relates to programmable integrated circuit devices, more particularly to field programmable logic devices which include flip flops in their architecture.

BACKGROUND OF INVENTION

Field programmable logic devices such as PLAs and FPGAs sometimes provide storage devices for receiving and storing logic values generated by logic portions of the device. The simplest storage device is a latch, which in one mode passes input date through to the output and in another modes stores an input value present at the time a clock signal causes the latch to store the value. Two latches in series form a D flip flop which has the advantage of being able to move a data signal from input to output at a selected time. More complex flip flops include the T flip flop which toggles (changes state of) the output at a clock edge if the input is high. A JK flip flop receives two signals J and K and provides four output choices in response to the J and K values. If J and K are both low, the Q output signal does not change from a previous value. If J and K are both high, the Q output is switched from its previous value at a clock edge. If J is high and K is low, the Q output becomes high. If K is high and J is low, the Q output becomes low. These three types of flip flops are commonly used by logic designers, and it is, therefore, desirable to obtain at least these three options in a user programmable storage device. Any of these options can be provided by adding appropriate gates to the logic signals which drive the D input of a D flip flop.

In past logic devices, such as those available from Xilinx, Inc. described in the 1992 "The Programmable Gate Array Data Book" available from Xilinx, Inc. 2100 Logic Drive, San Jose, Calif. 95124, a D flip flop is expressly provided, and logic to form the T or JK options with a D flip flop is generated in a lookup table which provides combinatorial functions of its inputs. However, this lookup table consumes a fair amount of chip area to generate a relatively simple function.

Users also frequently desire to provide parallel inputs to a flip flop, selecting one of two inputs or providing a logic function of two inputs as input to a D flip flop. In addition, users may wish to load a flip flop asynchronously, bypassing the clock control. This loading is typically available on set or reset inputs to a D flip flop. However, the set and reset inputs are typically driven by a global signal and are therefore not accessible individually for changing the values in the flip flop.

SUMMARY OF THE INVENTION

According to the present invention, hardware is provided in a user configurable logic integrated circuit chip to allow a user to select multiple storage functions such as D, T, JK, to receive multiple input signals and generate a storage input signal using a function such as OR or MUX, and to allow parallel load and asynchronous load options. A relatively small hardware area can offer these functions, which are commonly used, and can leave general purpose logic for other more complex functions, thus increasing the amount of logic which a user may implement in a given silicon area.

DETAIL DESCRIPTION OF SOME EMBODIMENTS OF THE PRESENT INVENTION

Figure 1:
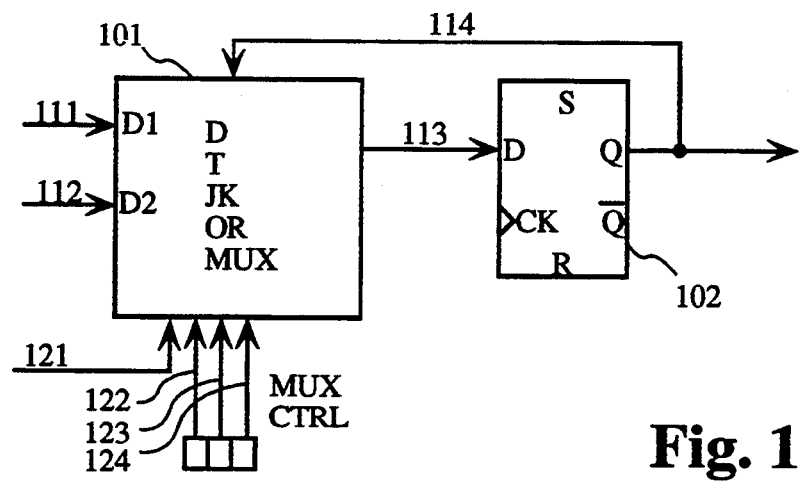
FIG. 1 shows a symbol representing a flip flop of the present invention in which optional D, T, JK, OR, and MUX functions of two variables can be provided to the D input of a D flip flop.

As shown in FIG. 1, two inputs, D1 and D2, are provided to function selector 101. Function selector 101 is controlled by MUX control signals 121 to 124 to select between five functions, D, T, JK, OR, and MUX. In other embodiments, additional functions such as AND, XOR, may also be provided. As determined by MUX control signals 121 through 124, the selected function of inputs D1 ad D2 is provided on line 113 to the D input of a D flip flop. The Q output of D flip flop 102 is also fed back on line 114 for use in the T and JK functions.

Figure 2:
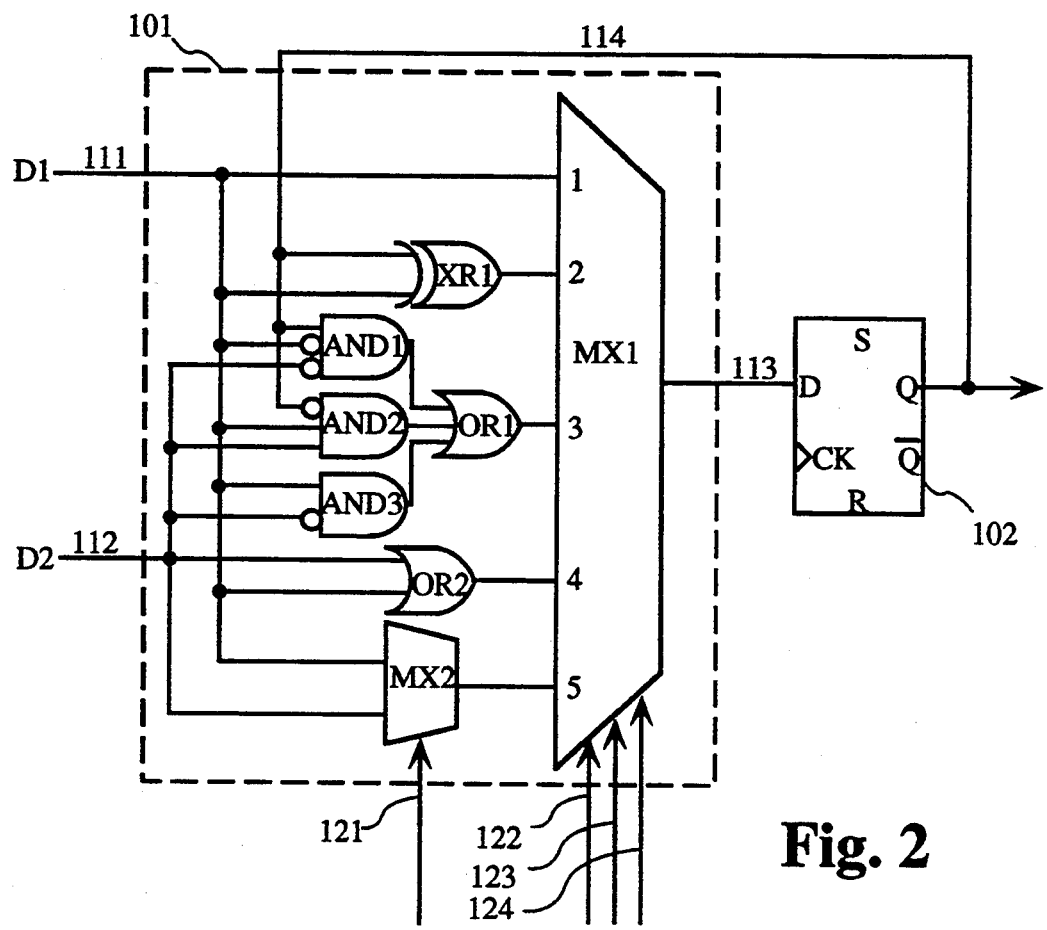
FIG. 2 shows one implementation of the flip flop of FIG. 1.

FIG. 2 shows an implementation of the flip flop of FIG. 1. Multiplexer MX1 receives five inputs representing the five functions available. The selection of one of the five inputs to multiplexer MX1 is controlled by multiplexer control lines 122, 123, and 124. When input 1 is selected, multiplexer MX1 forwards the D1 input signal on line 113 to D flip flop 102. When input 2 of multiplexer MX1 is selected, the XOR function of the D1 signal and the Q output signal is forwarded on line 113, thus creating a T function. When D1 is low, the Q output signal is fed back through XOR gate XR1 and multiplexer MX1 to the D input of flip flop 102, thus the Q output remains at its current value. When D1 is high, the Q output signal is inverted by XOR gate XR1 before being fed through multiplexer MX1 to the D input of flip flop 102 so that when clock signal CK goes high, the Q output signal switches to its other state.

Multiplexer input 3 receives the JK function. This function is provided by OR gate OR1, which receives inputs generated by AND gates AND1, AND2, and AND3. When inputs D1 and D2 are both low, the inverted values of D1 and D2 are fed to AND gate AND1 are both high, and allow AND gate AND1 to output the value of Q to OR gate OR1, thus causing multiplexer MX1 to feed the Q output of D flip flop 102 back to the D input of D flip flop 102. When inputs D1 and D2 are both high, AND gate AND2 causes the inverted value of the Q output signal to be fed to OR gate OR1 and thus to the D input of flip flop 102, thus toggling the Q output. When D1 is high and D2 is low, AND gate AND3 generates a high output signal which is transferred by OR gate OR1 to the D input of D flip flop 102. When D1 is low and D2 is high, none of AND gates AND1, AND2, and AND3 outputs a high signal, therefore OR gate OR1 forwards a low signal to the D input of flip flop 102. Note that when D1 and D2 are not equal, AND gates AND1 and AND2 always provide a low output signal thus causing OR gate OR1 to forward the signal from AND gate AND3. Thus input 3 of multiplexer MX1 receives the JK function for a JK flip flop.

When input 4 is selected, multiplexer MX1 receives the signal from OR gate OR2, which is the OR function of inputs D1 and D2.

Regarding input 5, multiplexer MX2 receives the D1 and D2 inputs and provides on input 5 of multiplexer MX1 the selected one of the two values D1 and D2 selected by multiplexer control signal 121, which is then forwarded to the D input of D flip flop 102. Thus the function of FIG. 1 is implemented by the circuit of FIG. 2.

Figure 3:
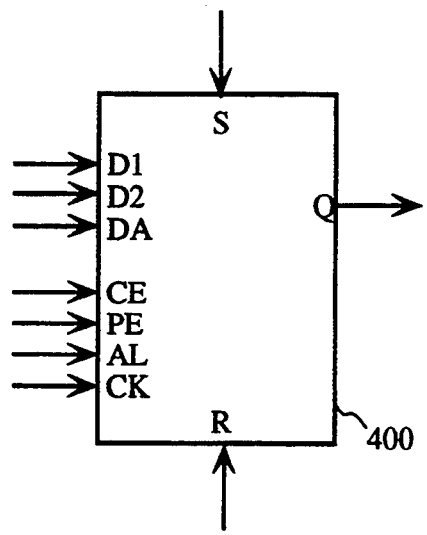
FIG. 3 shows a symbol for a parallel load flip flop including asynchronous load capability.
Figure 4:
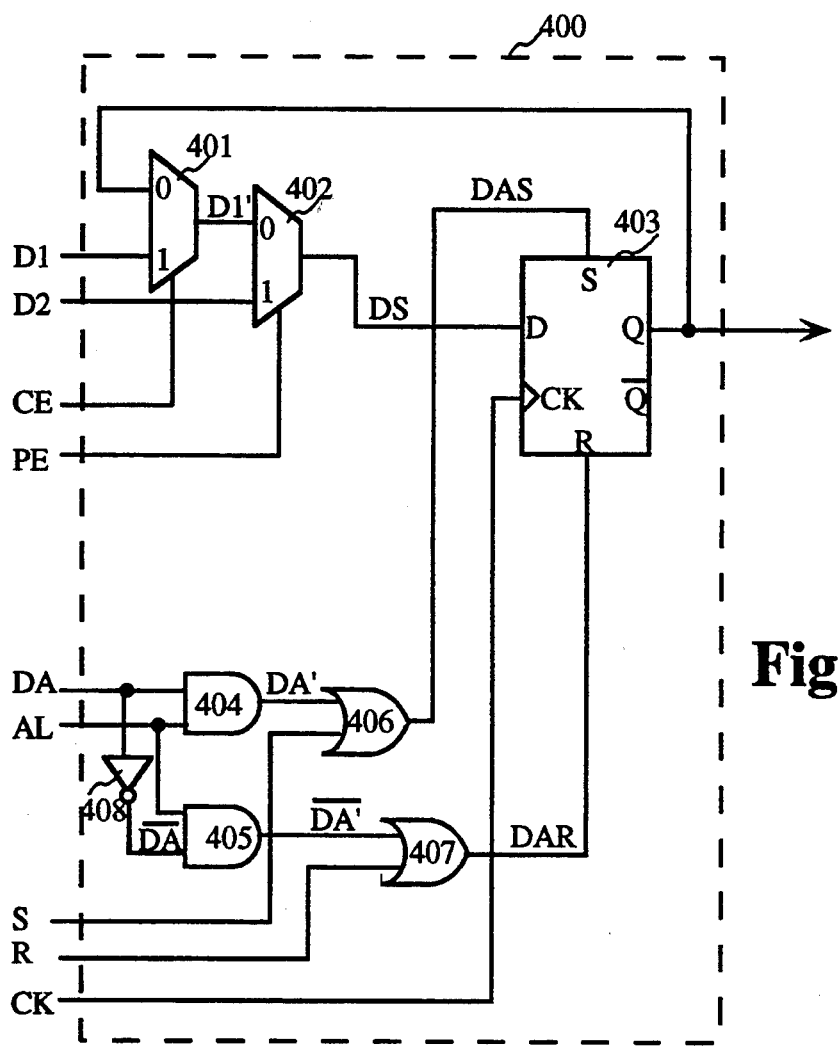
FIG. 4 shows an implementation of the flip flop of FIG. 3.

FIG. 3, which may replace the D flip flop 102 of FIGS. 1 and 2, or may be implemented in combination with FIGS. 1 and 2. In addition to the S and R input signals and the D (line 113) and clock input signals, the embodiment of FIG. 3 includes a second data input signal D2, an asynchronous input signal DA, a clock enable signal CE, a parallel load enable signal PE, and an asynchronous load signal AL. Implementation of the D flip flop of FIG. 3 is shown in FIG. 4. Multiplexer 401 is controlled by the clock enable signal CE. When CE is low, the value on D1' will be the current Q output value. Multiplexer 402 receives the multiplexer 401 output D1' and the parallel data signal D2. When parallel enable signal PE is logical high, the input signal on line D2 will be selected rather than the D1' signal from multiplexer 401, and this value is forwarded on line DS to the D input of flip flop 403. When parallel enable signal PE is low, the parallel load is not enabled, and the signal on line D1' is forwarded on line DS to the D input of flip flop 403. Thus a parallel load option that overrides the clock enable signal CE is provided by multiplexer 402. Additionally, an asynchronous load feature is provided by AND gates 404 and 405 in combination with OR gates 406 and 407 and inverter 408. When the signal on asynchronous load input AL is a logical low, AND gates 404 and 405 provide logical low output signals on lines DA' and $\overline{DA}$'. When signals DA' and $\overline{DA}$' are both low, OR gates 406 and 407, which receive, respectively, the set and reset inputs respond to the set and reset inputs in controlling the set and reset functions of D flip flop 403. When asynchronous load enable signal AL is high, one of AND gates 404 and 405 will provide a high output signal. This output signal is determined by the asynchronous data line DA. When the signal on line DA is high, AND gate 404 will provide a high output signal on line DA' and will provide a low output signal on line $\overline{DA}$'. When the signal on asynchronous date line DA is low, inverter 408 will cause AND gate 405 to provide a high output signal on line $\overline{DA}$' to OR gate 407. This high signal on line DAR applied to the reset input of D flip flop 403 loads a low value asynchronously into the D flip flop.

In summary, the flip flop of the present invention provides an alternative parallel load through multiplexers 401 and 402 for parallel signals D1 and D2. Further, the invention provides an asynchronous load of data signal DA which bypasses any clock signal or chip enable signal or even parallel enable signal. When flip flop 403 is implemented as shown in FIGS. 1 and 2, the flip flop can provide alternative configurations including a D flip flop, a T flip flop, a JK flip flop, a logic function such as an OR function, and a multiplexer function.

Figure 5:
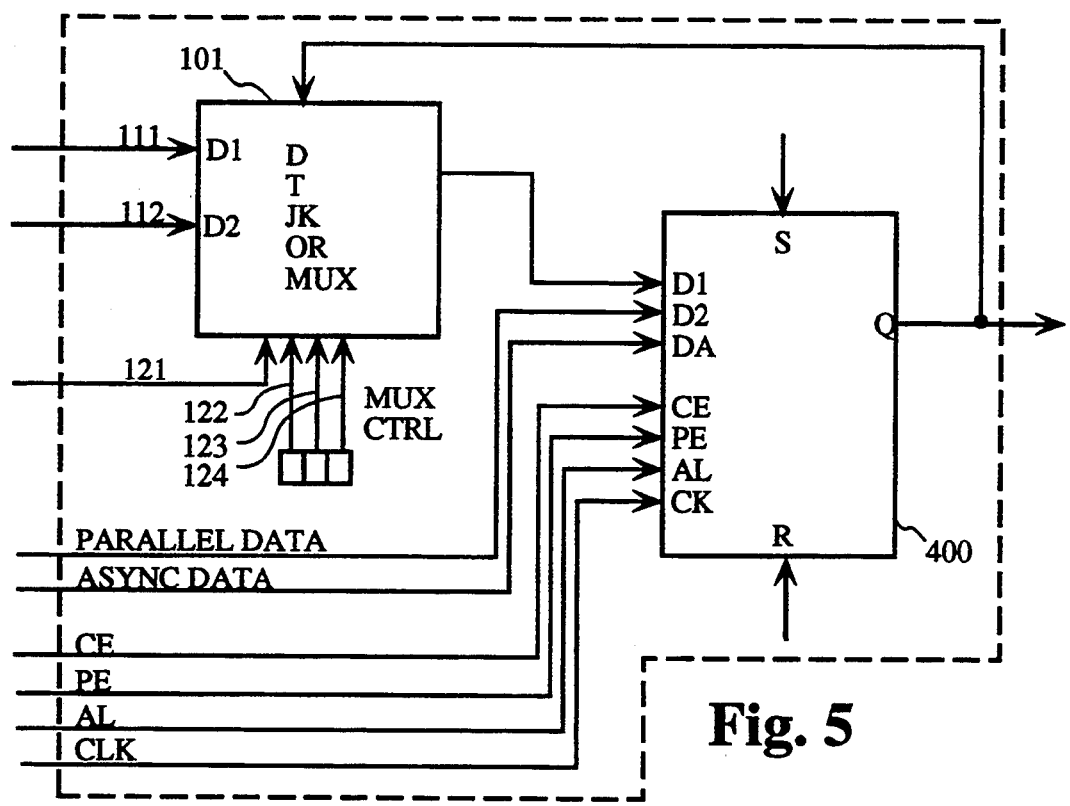
FIG. 5 shows a circuit which combines the flip flop of FIG. 1 and the parallel load flip flop of FIG. 3.

FIG. 5 shows a circuit which combines the optional function flip flop 101 of FIG. 1 with the parallel load flip flop 400 of FIG. 3.

Figure 6:
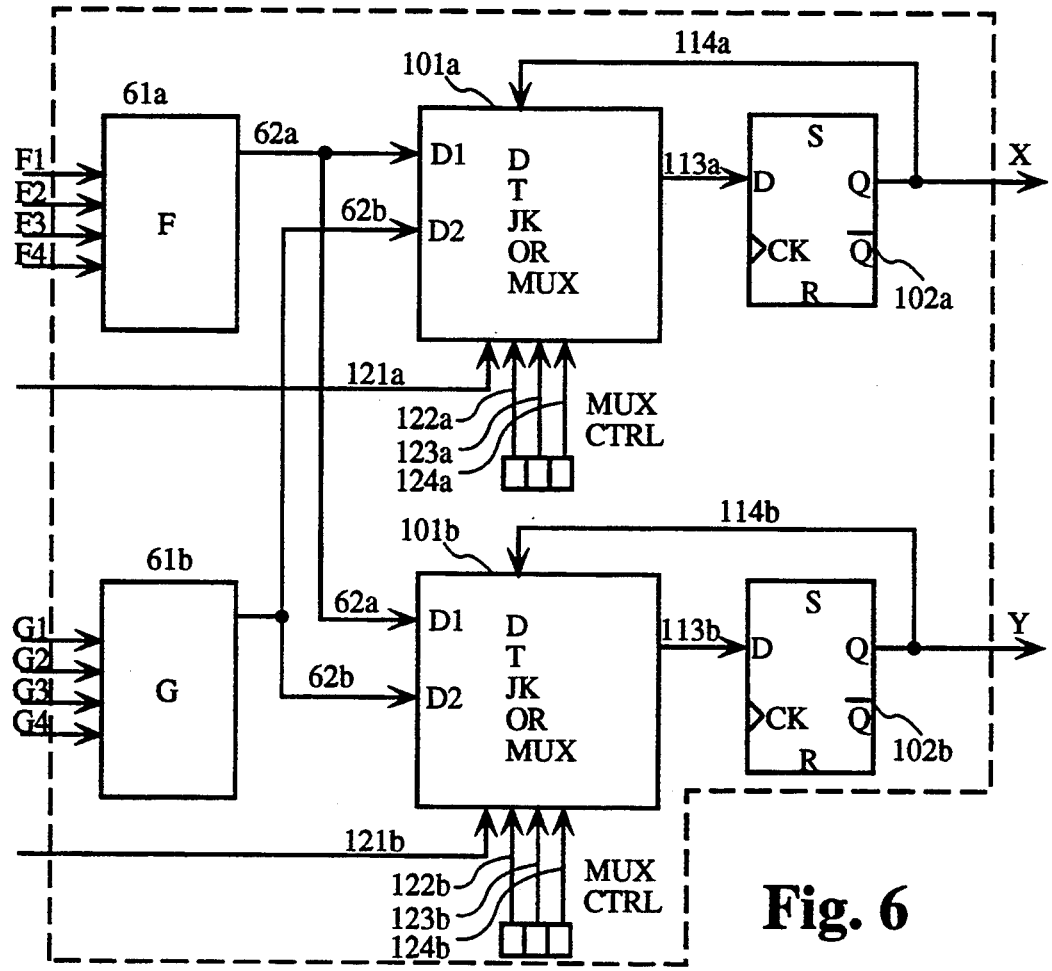
FIG. 6 shows an example logic block for an FPGA which uses flip flops as shown in FIG. 1.

FIG. 6 shows a logic block for an FPGA which uses flip flops 101 and 102 as shown in FIG. 1 in combination with lookup table function generators 61a and 61b, also labeled F and G. F function generator 61a includes a 16-bit lookup table which can be loaded to provide any combinational function of the four inputs F1, F2, F3, and F4. Likewise, the G function generator provides all combinational functions of the four inputs G1, G2, G3, and G4. Function selectors 101a and 101b combine the outputs 62a and 62b of F and G function generators 61a and 61b with feedback signals 114a and 114b from the Q outputs of flip flops 102a and 102b. Thus the output signals X and Y may both be functions of the eight input signals F1 through G4.

In light of the above description, additional embodiments will become obvious to those skilled in the art.

We claim:

1. A flipflop comprising:
   a D flipflop having at least a data input, a clock input, and an output;
   means for receiving a plurality of signals;
   means for processing said plurality of signals according to a user-specified function to generate an intermediate output;
   means for providing said intermediate output to an input of said D flipflop in which said means for receiving a plurality of signals receives a first signal D1 and a second signal D2; and further comprising:
   means for receiving a clock enable signal;
   means for receiving a parallel enable signal;
   a first multiplexer which receives as input said first signal D1 and a signal Q from said output signal which is controlled by said clock enable signal, and which generates a first multiplexer output signal;
   a second multiplexer which receives as input said first multiplexer output signal and said second signal D2 and is controlled by said parallel enable signal and generates a second multiplexer output signal which drives said input of said D flipflop.

2. A flipflop as in claim 1 in which said D flipflop further comprises;
   a set input and a reset input;
   and further comprising:
   means for receiving a second plurality of signals;
   means for processing said second plurality of signals according to a user specified function to generate a second intermediate output;
   means for providing said second intermediate output to one of said inputs of said D flipflop.

3. A flipflop as in claim 2 in which
   said second plurality of signals comprises:
   an asynchronous load enable signal, and
   an asynchronous data signal; and
   said means for providing said second intermediate output to one of said inputs of said D flip flop comprises:
   means for providing a high signal to said set input when said asynchronous load enable signal and said asynchronous data signal are high, and
   means for providing a high signal to said reset input when said asynchronous load enable signal is high and said asynchronous data signal is low.

* * * * *